United States Patent
Hennessy (10) Patent No.: US 12,081,222 B2
(45) Date of Patent: Sep. 3, 2024

(54) MECHANICAL RESONATOR-BASED OSCILLATORS AND RELATED METHODS FOR GENERATION OF A PHASE USED TO COMPENSATE FOR TEMPERATURE-DEPENDENT FREQUENCY ERRORS

(71) Applicant: Panasonic Intellectual Property Management Co., Ltd., Osaka (JP)

(72) Inventor: Ryan P. Hennessy, Northborough, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/932,446

(22) Filed: Sep. 15, 2022

(65) Prior Publication Data
US 2024/0106436 A1    Mar. 28, 2024

(51) Int. Cl.
H03L 1/00    (2006.01)
H03L 1/02    (2006.01)

(52) U.S. Cl.
CPC ................. H03L 1/022 (2013.01)

(58) Field of Classification Search
CPC ....................................... H03L 1/022
USPC ........................................... 331/34
See application file for complete search history.

(56) References Cited

U.S. PATENT DOCUMENTS

| | | | |
|---|---|---|---|
| 5,540,094 A | 7/1996 | Varnham et al. | |
| 6,598,455 B1 | 7/2003 | Gutierrez et al. | |
| 7,221,230 B2 | 5/2007 | Partridge et al. | |
| 8,446,222 B2 | 5/2013 | Brenndorfer | |
| 8,464,571 B1 | 6/2013 | Sparks et al. | |
| 9,306,580 B2 | 4/2016 | Kiyohara | |
| 9,459,100 B2 | 10/2016 | Balachandran et al. | |

(Continued)

FOREIGN PATENT DOCUMENTS

JP    2016-006950 A    1/2016

OTHER PUBLICATIONS

International Search Report and Written Opinion issued in PCT application No. PCT/JP2023/016231 dated Jul. 18, 2023.

*Primary Examiner* — Joseph Chang
(74) *Attorney, Agent, or Firm* — PEARNE & GORDON LLP (57) ABSTRACT

A mechanical resonator-based oscillator comprises an input signal generator configured to output an input signal, a mechanical resonator comprising a body configured to vibrate according to the input signal and to output a vibration signal, a phase detector configured to detect a relative phase of the vibration signal with respect to the input signal, and a frequency synthesizer configured to produce a temperature-insensitive oscillation output based on the relative phase. The input signal generator comprises an adder configured to add the drive amplitude to the tone amplitude to produce an amplified pilot tone, and a mixer configured to modulate the amplified pilot tone with the drive frequency to produce the input signal. The oscillator further comprises a temperature compensator determines a multiplier to scale the relative phase, wherein the frequency synthesizer performs a scale operation on the vibration signal by the multiplier to produce the temperature-insensitive oscillation output.

20 Claims, 10 Drawing Sheets

(56) References Cited

U.S. PATENT DOCUMENTS

| | | |
|---|---|---|
| 9,537,448 B2 | 1/2017 | Fukuzawa |
| 10,027,331 B2 | 7/2018 | Yonezawa et al. |
| 10,148,272 B2 | 12/2018 | Wang |
| 10,309,782 B2 | 6/2019 | Kapusta et al. |
| 10,389,370 B2 | 8/2019 | Tsubota et al. |
| 10,578,435 B2 | 3/2020 | Lin et al. |
| 10,626,009 B2 | 4/2020 | Keal |
| 10,921,124 B2 | 2/2021 | Hughes |
| 11,031,937 B2* | 6/2021 | Nanaiah .................. H03K 19/02 |
| 2005/0257596 A1 | 11/2005 | Fell et al. |
| 2008/0170742 A1 | 7/2008 | Trusov et al. |
| 2009/0083011 A1 | 3/2009 | Hao |
| 2011/0163817 A1* | 7/2011 | Nakamura ......... H03H 9/02409 |
| | | 331/18 |
| 2011/0193449 A1* | 8/2011 | Phan Le .................. H03B 5/30 |
| | | 310/317 |
| 2014/0159826 A1* | 6/2014 | Phan Le .................. H03B 5/42 |
| | | 331/154 |
| 2015/0102862 A1 | 4/2015 | Ishimaru et al. |
| 2017/0307374 A1 | 10/2017 | Hughes |
| 2017/0310326 A1 | 10/2017 | Nakajima |

* cited by examiner

MECHANICAL RESONATOR-BASED OSCILLATORS AND RELATED METHODS FOR GENERATION OF A PHASE USED TO COMPENSATE FOR TEMPERATURE-DEPENDENT FREQUENCY ERRORS

TECHNICAL FIELD

The present disclosure relates to apparatus and methods for using a mechanical resonator in sustained oscillation at its resonance frequency as an oscillator. In particular, the apparatus and methods compensate temperature-dependent fundamental parameters of the mechanical resonator to produce a temperature compensated oscillators (TCXO) output frequency.

BACKGROUND

Oscillators are used as clocks to offer high-precision timings for such electronics applications. Core parameters of timing oscillators include cost, power consumption, size, precision, accuracy, frequency stability over temperature, jitter, and phase noise, with different applications requiring different specifications for each of these parameters.

High performance applications such as computer networking and telecommunications require clocks with very low jitter and very high temperature stability, often at the expense of cost and size. For oscillators used in these clock applications, mechanical resonators are desirable because the high Quality Factor (Q) achievable results in low jitter and phase noise.

On the other hand, the temperature stability performance of mechanical resonators can suffer because the resonant frequency is dependent on the temperature-sensitive material properties of the resonator.

For this reason, a temperature sensor must be used to compensate for frequency errors (i.e., deviations from the desired output frequency) due to temperature variations. Adding a temperature sensor, however, may increase the cost of the oscillator, as well as introducing error due to the physical separation of the temperature sensor and resonator. So, there is a need to improve temperature compensated oscillators.

BRIEF SUMMARY

To address the above problems, the present disclosure provides a mechanical resonator-based oscillator, in which a harmonic pilot tone at a certain frequency is amplitude modulated onto the input signal to the resonator, and a phase of the amplitude modulated tone at the output of the resonator is measured with respect to a phase of the input tone. Then, a change in the phase is determined as a measurement of the combination of change in the temperature-dependent fundamental parameters of the mechanical resonator, undamped resonant frequency (o % n) and Quality Factor (Q). As a result, the phase change is used as a temperature sensor to compensate for the temperature-dependent frequency error of the oscillators.

In one aspect, a mechanical resonator-based oscillator comprises an input signal generator configured to output an input signal, a mechanical resonator comprising a body configured to vibrate according to the input signal and to output a vibration signal, a phase detector configured to detect a relative phase of the vibration signal with respect to the input signal, and a frequency synthesizer configured to produce a temperature-insensitive oscillation output based on the relative phase.

In one embodiment, the mechanical resonator-based oscillator further comprises a transducer configured to transduce the input signal from an electrical domain to a mechanical domain and force the mechanical resonator into vibration.

In another embodiment, the mechanical resonator-based oscillator further comprises a filter configured to receive the displacement signal and remove a lower-frequency signal from the received displacement signal to produce a vibration signal.

Also, the mechanical resonator-based oscillator may further comprise a demodulator configured to demodulate the displacement signal using the vibration signal to extract the pilot tone.

Further, the mechanical resonator-based oscillator may further comprise an oscillation driving circuitry configured to supply the signal of the drive amplitude and of the drive frequency to the input signal generator.

In addition, the input signal generator may comprise an adder configured to add the drive amplitude to the tone amplitude of the pilot tone to produce an amplified pilot tone, and a mixer configured to modulate the amplified pilot tone with the drive frequency to produce the input signal.

Additionally, the mechanical resonator-based oscillator may further comprise a temperature compensator configured to determine a multiplier to scale the relative phase, wherein the frequency synthesizer is configured to perform a scale operation on the vibration signal by the multiplier to produce the temperature-insensitive oscillation output.

Furthermore, the temperature compensator may determine a multiplier function n(T) to scale a relative phase function $\phi(T)$, wherein the multiplier function n(T) indicates changes in the multiplier over temperatures, and the relative phase function $\phi(T)$ indicates changes in the relative phase over temperatures, T being a temperature.

In one embodiment, the mechanical resonator-based oscillator may further comprise a tone oscillator configured to provide a tone frequency of the pilot tone to the input signal generator, wherein the tone oscillator is independent from mechanical resonator-based oscillator.

In another embodiment, the mechanical resonator-based oscillator may further comprises a frequency divider configured to divide the temperature-insensitive oscillation output and provide a divided portion of the temperature-insensitive oscillation output to the input signal generator as a tone frequency of the first pilot tone.

In yet another embodiment, the mechanical resonator-based oscillator comprises a frequency divider configured to divide the drive frequency of the oscillation driving circuitry and provide a divided portion of the drive frequency to the input signal generator as a tone frequency of the first pilot tone.

In the above mechanical resonator-based oscillators, an offset tone of the input signal $\omega_{Tone}$ may be defined by:

$$\omega_{Tone} = \omega_n + XBW_0$$

wherein X is a positive scalar of a resonator fixed-temperature mechanical bandwidth $BW_0$:

$$BW_0 = \frac{(\omega_n)_0}{2Q_0}$$

wherein $(\omega_n)_0$ and $Q_0$ are the undamped natural frequency and quality factor of the mechanical resonator at a fixed temperature, respectively.

In the above mechanical resonator-based oscillators, a value of X is selected such that the mechanical resonator-based oscillator comes to have an optimal total sensitivity of the relative phase function $\phi(T)$ with respect to a temperature range within which the mechanical resonator-based oscillator is supposed to operate.

In another aspect, a method of operating a mechanical resonator-based oscillator, comprises providing an input signal, applying the input signal to vibrate a body of a mechanical resonator to output a vibration signal, detecting a relative phase of the pilot tone extracted from the vibration signal with respect to the input signal, and producing a temperature-insensitive oscillation output based on the relative phase of the vibration signal.

In one embodiment, the combining step further comprises adding the drive amplitude to the tone amplitude of the pilot tone to produce an amplified pilot tone, and modulating the amplified pilot tone with the drive frequency to produce the input signal.

In another embodiment, the method further comprises filtering out, by a filter, a lower-frequency signal from the received displacement signal to produce a vibration signal; and demodulating the displacement signal using the vibration signal to extract the pilot tone.

In yet another embodiment, the producing step comprises determining a multiplier to scale the vibration signal, and multiplying the vibration signal with the multiplier to produce the temperature-insensitive oscillation output.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, coupled to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document; those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

FIG. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system and method. The following description with reference to the accompanying drawings is provided to assist in a comprehensive understanding of various embodiments of the present disclosure as defined by the claims and their equivalents. It includes various specific details to assist in that understanding but these are to be regarded as mere examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

It should be apparent to those skilled in the art that the following description of various embodiments of the present disclosure is provided for illustration purposes only and not for the purpose of limiting the present disclosure as defined by the appended claims and their equivalents.

Although ordinal numbers such as "first," "second," and so forth will be used to describe various components, those components are not limited herein. The terms are used only for distinguishing one component from another component.

For example, a first component may be referred to as a second component and likewise, a second component may also be referred to as a first component, without departing from the teaching of the inventive concept.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or a combination thereof, but do not preclude the presence or addition of one or more other features, numbers, steps, operations, components, elements, or combinations thereof.

Figure 1:
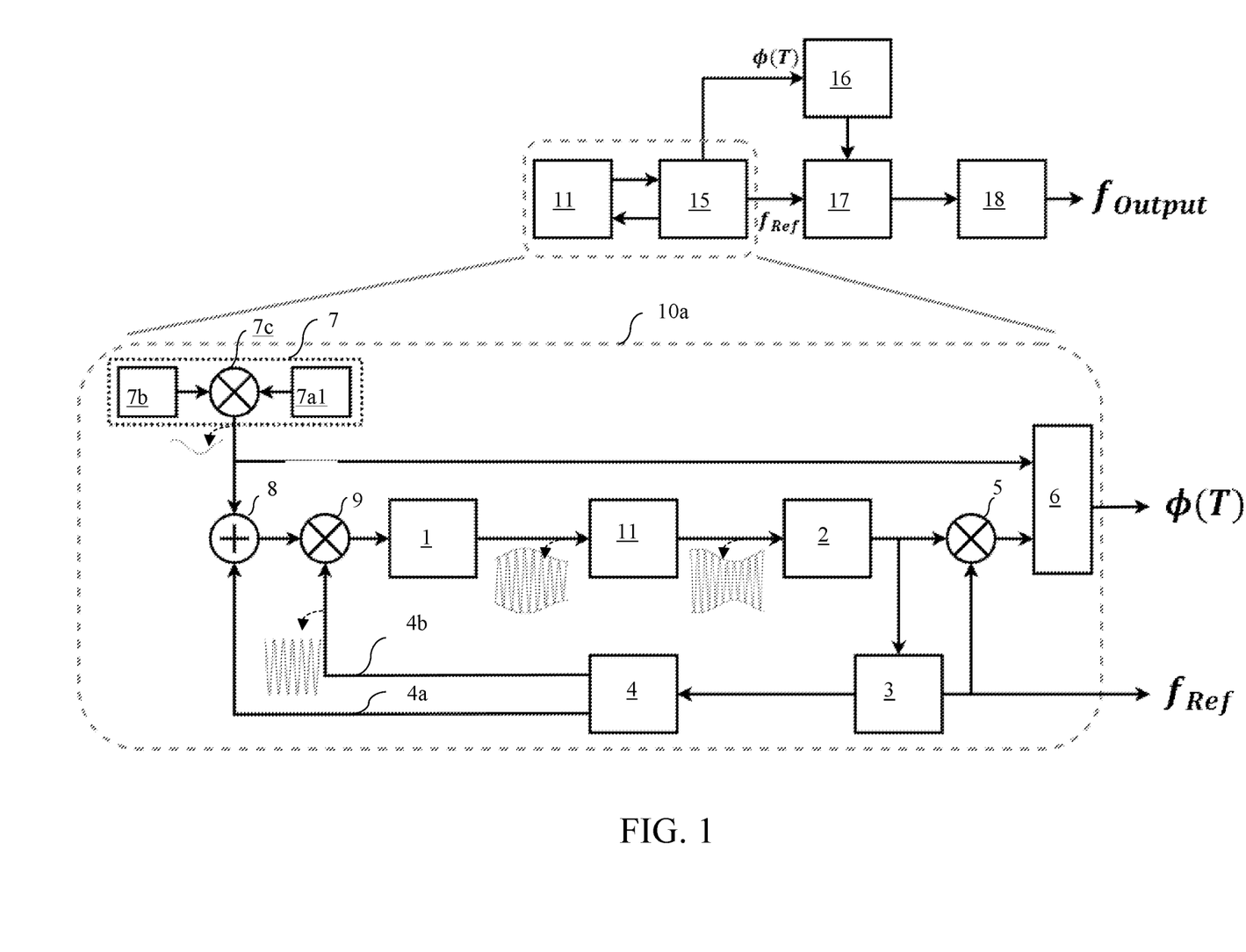
FIG. 1 illustrates an example block diagram of a mechanical resonator-based oscillator circuit according to one embodiment of the present disclosure.

FIG. 1 illustrates an example block diagram of mechanical resonator-based oscillator circuit 10 according to one embodiment of the present disclosure.

Mechanical resonator-based oscillator 10 includes mechanical resonator 11 and oscillation supporting circuit 15, which are expanded to diagram block 10a, as illustrated in FIG. 1. Mechanical resonator-based oscillator 10 further includes temperature compensator 16, frequency synthesizer 17, and output condition circuitry 18.

Mechanical resonator 11 is a physical device with a force input and a displacement output. The transfer function from the force input to the displacement output is governed by Equations 3, 4 and 5 described below in detail. When combined with the active feedback circuitry to sustain vibration, mechanical resonator 11 functions as an oscillator. Such an oscillator can be used for electronics timing applications. Examples of mechanical resonators include microelectromechanical systems (MEMS), nanoelectromechanical systems (NEMS), bulk acoustic wave (BAW), surface-acoustic-wave (SAW), quartz crystal (XTAL), and Thin-film bulk acoustic resonator (FBAR).

Oscillation supporting circuit 15 has two functions. First, oscillation supporting circuit 15 sustains the oscillation of mechanical resonator 11. Second, oscillation supporting circuit 15 generates a temperature-dependent signal. Specifically, oscillation supporting circuit 15 feeds mechanical resonator 11 with an input signal containing a pilot tone and calculates a relative phase function $\phi(T)$ of the tone outputted from mechanical resonator 11 with respect to the tone inputted into mechanical resonator 11.

Temperature compensator 16 determines a multiplier function n(T) to scale the temperature-sensitive vibration frequency $f_{Ref}$. Once multiplier function n(T) is determined, frequency synthesizer 17 performs the scaling operation of $f_{Ref}*n(T)$ to produce a temperature-insensitive TCXO output frequency.

Output condition circuitry 18 may include circuitry necessary to condition the output frequency into the form required by a timing application device for which mechanical resonator-based oscillator circuit 10 is used. Different timing applications have different requirements for the output of a TCXO, such as a waveform, amplitude, offset, output impedance, and power handling.

As shown in diagram block 10a, oscillation supporting circuit 15 includes force generator 1 for generating force to vibrate mechanical resonator 11, displacement detector 2, filter 3, and oscillation driving circuitry 4 for supplying a driving signal of drive amplitude 4a and drive frequency 4b.

Oscillation supporting circuit 15 also includes tone generator 7 comprising a mixer 7c that mixes tone amplitude 7b and tone frequency 7a1 to generate a pilot tone. Then, the pilot tone is added with drive amplitude 4a at adder 8, and then is modulated with drive frequency 4b at mixer 9 to produce an input signal.

Subsequently, the input signal is fed to input force generator 1, in which a combination of electronics (such as an amplifier) and a transducer are employed to transduce the input signal from the electrical domain to the mechanical domain and force the mechanical resonator 11 into vibration. As an example, in a capacitively driven (microelectromechanical systems) MEMS resonator, a voltage waveform is outputted from a voltage amplifier fed with the input signal and applied to one side of a capacitive structure that transduces the voltage waveform into a force waveform.

Displacement detector 2 detects the displacements of vibrating mechanical Resonator 11. To do so, displacement detector 2 may employ a combination of electronics (such as an amplifier) and a transducer to transduce the displacement signal from the displacement in the mechanical domain to the electrical domain. For example, in a capacitively sensed MEMS device, the displacement of one side of a biased capacitive structure is sensed by the induced current on the opposing side of the capacitive structure. This electrical current can be converted into the voltage domain (and amplified) using a transimpedance amplifier to produce a displacement signal.

Filter 3 receives the displacement signal, which contains a higher-frequency carrier signal in the amplitude modulation scheme. Then, filter 3 may strip the lower-frequency message signal from the received displacement signal to produce a vibration frequency $f_{ref}$, which is a temperature-sensitive frequency. Filter 3 may be a high-pass or band-pass filter to achieve this end.

Oscillation driving circuit 4 includes the circuitry necessary to form an active feedback loop to sustain oscillation of the vibrating mechanical resonator 11. A vibration sustaining active feedback loop may be purely analog, such as a loop designed to meet the Barkhausen criteria using an automatic gain controller (AGC) in conjunction with a variable gain amplifier (VGA). A known fully-analog Phase Locked Loop (PLL) may also be used in place of a combination of AGC and VGA systems to constitute a vibration sustaining active feedback loop. A vibration sustaining active feedback loop could also be mixed-signal, such as a mixed-signal PLL employing a digital proportional-integral-derivative (PID) controller.

Demodulator 5 includes circuitry configured to demodulate the displacement signal by using vibration frequency $f_{ref}$ to produce the pilot tone coming out the mechanical resonator 11. The vibration frequency $f_{ref}$ is a temperature-sensitive frequency, so that it will be compensated in temperature compensator 16 and frequency synthesizer 17.

Phase detector 6 includes circuitry configured to detect a relative phase of the pilot tone coming out the mechanical resonator 11 with respect to the pilot tone going into the mechanical resonator 11. The pilot tone coming out the mechanical resonator 11 may be extracted from the displacement signal via filter 3 and demodulator 5.

Phase detector 6 also may put this measured relative phase into a form that the temperature compensator 16 requires. For example, if temperature compensator 16 requires a digital input, then phase detector 6 digitizes the phase measurement.

Mechanical resonator-based oscillator 10 according to the present embodiment may also be implemented on a computer including, for example, a central processing unit (CPU) or a processor, a read only memory (ROM), a random access memory (RAM), an input/output interface, a storage device such as a hard disk, and the like. Thus, for example, temperature compensator 16 and frequency synthesizer 17 can be implemented with a processor(s) and loading various processing programs stored in the storage device into the RAM and can be achieved by executing the programs in the processor(s).

Figure 2:
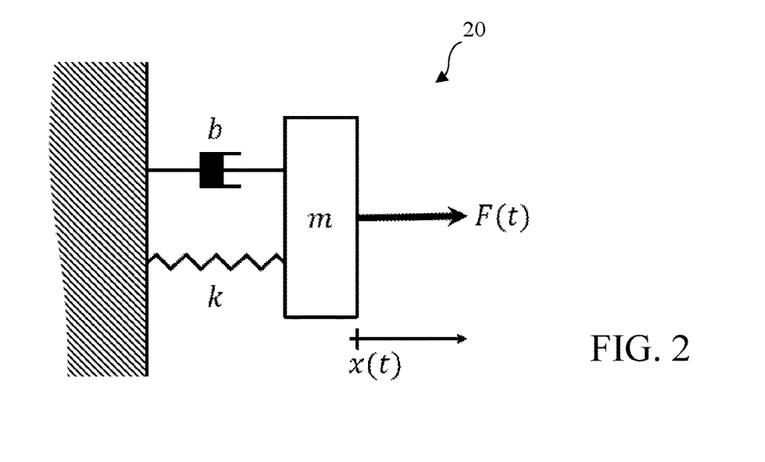
FIG. 2 illustrates an example modeling of a mechanical resonator as a single-degree-of-freedom spring-mass-damper model system.

FIG. 2 illustrates an example modeling of mechanical resonator 11 as a single-degree-of-freedom spring-mass-damper model system 20. The equation of motion of this model system 20 is $$m\ddot{x}+b\dot{x}+kx=F(t) \qquad (1)$$

where m is the mass, b is the damping coefficient, k is the spring stiffness, x(t) is the displacement of the proof mass, and F(t) is the force applied to the proof mass. Note that the same equation of motion governs the motion of a continuous or distributed parameter system, such as a vibrating body. In this case, m is the equivalent effective mass of the vibrating body of mechanical resonator 1, b is the equivalent effective damping coefficient, k is the equivalent effective stiffness, and x(t) is the displacement of a single point of the vibrating body.

If the model system 20 is excited harmonically, specifically $$F(t)=kA\cos\omega t \qquad (2)$$

with excitation frequency ω in radians/second and excitation force term kA (defining A in units of the displacement for convenience), the system is referred to as the resonator 11 and its output displacement response is $$x(t)=A\ G(\omega)\cos(\omega t-\phi(\omega)) \qquad (3)$$

Here, the non-dimensional displacement gain through the resonator (also referred to magnitude of the frequency response) is defined as $$G(\omega) = \frac{1}{\left\{\left[1-\left(\frac{\omega}{\omega_n}\right)^2\right]^2 + \left[2\zeta\left(\frac{\omega}{\omega_n}\right)\right]^2\right\}^{1/2}} \qquad (4)$$

and a phase of the resonator displacement output with respect to the force input is defined as $$\phi(\omega) = \tan^{-1}\frac{2\zeta\left(\frac{\omega}{\omega_n}\right)}{1-\left(\frac{\omega}{\omega_n}\right)^2} \qquad (5)$$

For these formulations, the damping factor is $$\zeta = \frac{b}{2m\omega_n} \qquad (6)$$

and natural frequency of undamped oscillation is $$\omega_n = \left(\frac{k}{m}\right)^{1/2} \qquad (7)$$

Figure 3:
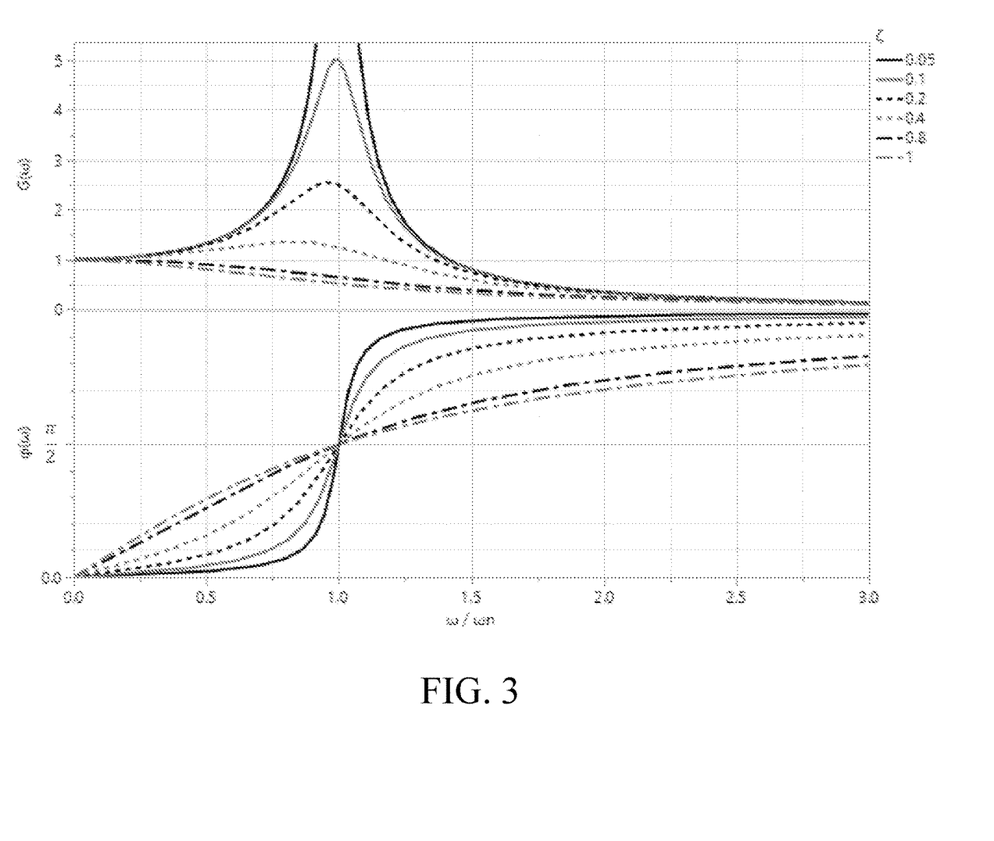
FIG. 3 illustrates examples of resonator response plots in the amplitude (Equations 4) and the phase (Equation 5) as the input frequency and damping factor are varied.

FIG. 3 illustrates examples of experimental resonator response plots in the amplitude (Equations 4) and the phase (Equation 5) as the input frequency and damping factor are varied.

Resonance is a condition conventionally defined as the resonator response when the excitation frequency ratio is equal to the damped natural frequency ratio, specifically $$\frac{\omega_D}{\omega_n} = (1-2\zeta^2)^{1/2} \qquad (8)$$

When a mechanical resonator is employed in an oscillator, the damped natural frequency is the typical operation point because at this frequency the peak amplitude response is achieved $$G(\omega_D)_{Peak} = \frac{1}{2\zeta(2-\zeta^2)^{1/2}} \qquad (9)$$

resulting in a maximum signal to noise ratio of the oscillator output. In cases of a very low damping (ζ<0.05), Quality factor (Q) of the mechanical resonator 11 is defined as $$Q = G(\omega_D)_{Peak} \approx \frac{1}{2\zeta} \qquad (10)$$

and the half-power mechanical bandwidth (BW) is readily derived as $$BW = \frac{\omega_n}{2Q} \qquad (11)$$

in units of the frequency.

An example of a mechanical resonator that can be used in TCXO applications is a silicon MEMS resonator. In silicon, the temperature-dependence of young's modulus (E) and coefficient of thermal expansion (CTE) result in resonators to having a temperature coefficient of frequency (TCF) of approximately −30 ppm/K.

In an automotive application, a typical temperature range, e.g., from −40 C to 105 C, would result in 4,350 ppm (or 0.435%) in frequency change, much larger than the typical 0.1 ppm specification for frequency temperature stability. The range of −40 C and 105 C is an example temperature range within which the automotive application embedded with the mechanical resonator 11 is supposed to operate, and other various temperature ranges may be selected based on the operating conditions and/or circumstances of different applications in which mechanical resonator 11 is adopted.

This highlights the need for temperature compensation. Quality factor (Q) for low pressure vacuum-packaged MEMS resonators can be on the order of 100,000 or higher. On the other hand, the dominant loss mechanisms at these Q levels, such as Thermo-Elastic Damping (TED) can be very sensitive to temperature. $Q_{TED}$ varies as 1/T and can vary on the order of 100% over the temperature range.

Figure 4:
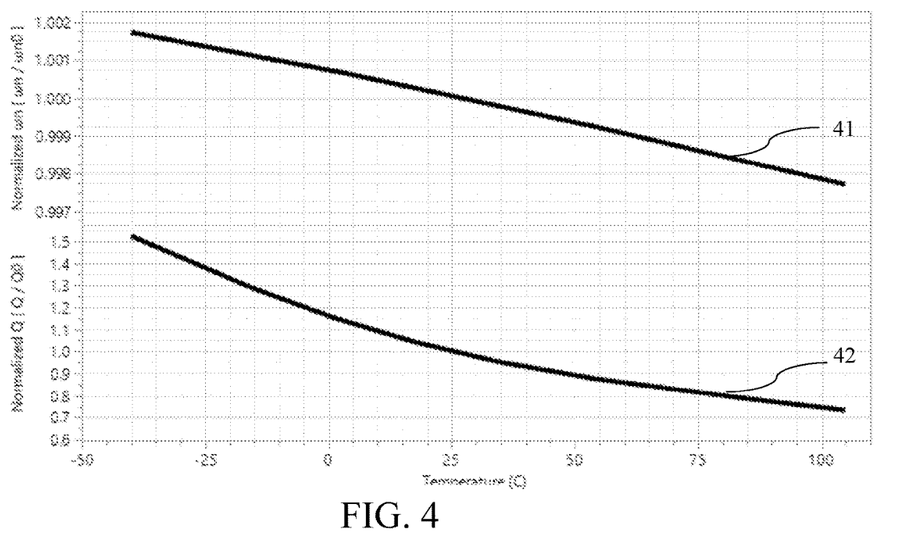
FIG. 4 illustrates example plots of the MEMS resonator normalized natural frequency $\omega_n$ and normalized quality factor Q, according to one embodiment of the present disclosure.

FIG. 4 illustrates example plots of the normalized natural frequency $\omega_n$ 41 and normalized quality factor Q 42 of an actual MEMS resonator, according to one embodiment of the present disclosure.

Note that $\omega_n$ and Q may be normalized by their nominal values at an operating temperature, e.g., 25 degree Celsius ($\omega_{n0}$ and $Q_0$, respectively). From the equations defined above, it is evident that the temperature-dependence of natural frequency on quality factor Q directly results in the temperature-dependence of the resonator fundamental behavior.

To demonstrate the temperature-dependence of the resonator behavior at or close to resonance, an offset tone frequency $\omega_{Tone}$ (a tone offset from resonance) of the input signal is introduced as follows:

$$\omega_{Tone} = \omega_n + XBW_0 \quad (12a)$$

$$\frac{\omega_{Tone}}{\omega_n} = 1 + X\frac{BW_0}{\omega_n} \quad (12b)$$

where X is a scalar parameter of the resonator's fixed-temperature mechanical bandwidth:

$$BW_0 = \frac{(\omega_n)_0}{2Q_0} \quad (12c)$$

and $(\omega_n)_0$ and $Q_0$ are the undamped natural frequency and quality factor of the mechanical resonator at a fixed temperature, respectively.

The factor X can theoretically range from $[0, \infty)$, however, is determined to be a value to increase the temperature-dependence (i.e., the total sensitivity) of the relative phase function $\phi(T)$.

Using the normalized resonator parameters in FIG. 4 and plugging Equation 12 into Equation 5 yields a total sensitivity to a temperature of a relative tone phase.

Figure 5:
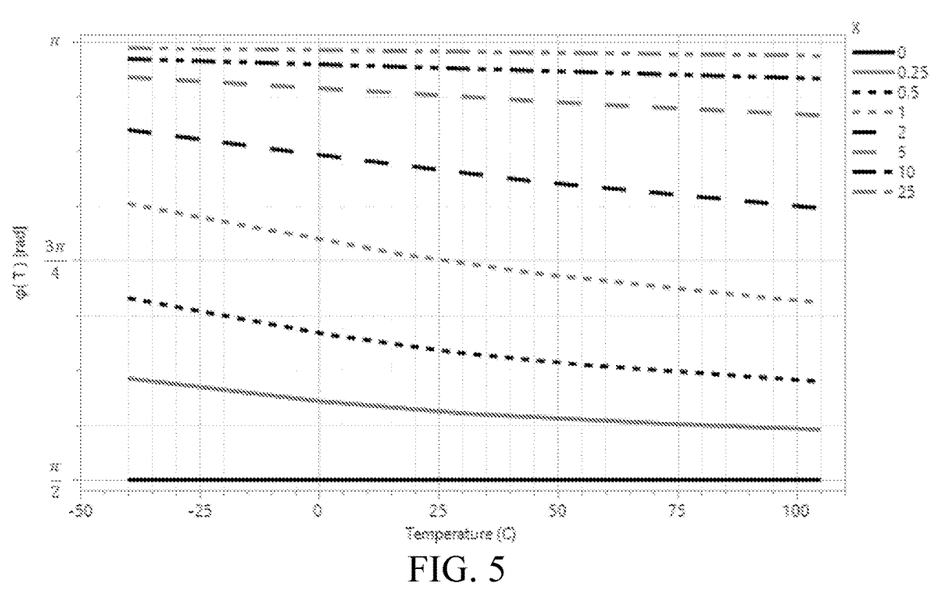
FIG. 5 illustrates example plots representing several tone phases $\phi(T)$ at a frequency over temperature according to different bandwidth parameters X.

FIG. 5 illustrates example plots representing the relative tone phase $\phi(T)$ at a frequency over temperature according to different bandwidth parameters X=0, 0.25. 0.5, 1, 2, 5, 10 or 25. As shown in the figure, each tone phase $\phi(T)$ with the different bandwidth parameters X at a frequency close to the resonance frequency of the resonator varies with temperature.

Total sensitivity to temperature of a tone phase through the resonator 11 may be defined as:

$$\Delta\phi(\omega_{Tone}) = (\omega_{Tone})|_{T=-40\,C} - \phi(\omega_{Tone})|_{T=105\,C} \quad (13)$$

Figure 6:
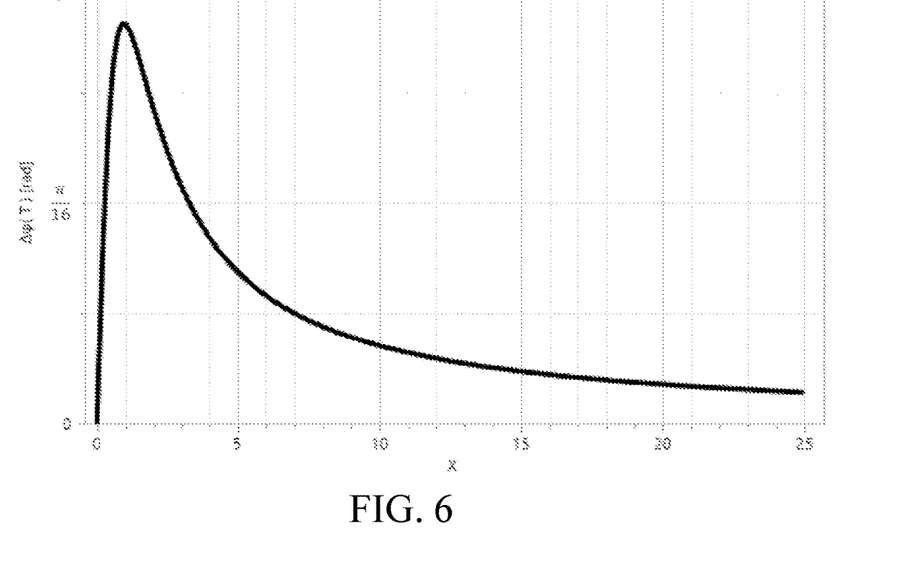
FIG. 6 illustrates that an example graph of a total sensitivity of a tone phase varies with different X values.

FIG. 6 illustrates that an example graph of a total sensitivity of a tone phase varying with different values of X. A change in the tone phase can be used as a 'thermometer' for temperature compensation if two conditions are met:

a. $\phi(\omega_{Tone})$ is monotonic with Temperature (i.e., $\frac{d\phi(\omega_{Tone})}{dT}$ does not cross zero)

b. $\Delta\phi((\omega_{Tone})>0$

FIG. 5 and FIG. 6 show that both conditions (a) and (b) are satisfied for all X>0, with an optimal (or maximum) total sensitivity at X≈1 for high-Q resonators. In some embodiments, the value of X is selected such that the total sensitivity of the relative phase function $\phi(T)$ with respect to the temperature range is greater than the average total sensitivity thereof. In the case of the plot of FIG. 6, the value of X is selected to be approximately 1, which results in the highest total sensitivity as defined by Equation 14.

The fundamental behavior outlined in FIG. 5 and FIG. 6 holds for mechanical resonators that have material properties with the same or similar temperature-dependence.

Optimal total sensitivity is desirable because it represents the largest change in $\phi(T)$ over the full temperature range. In other words, this operation point represents the upper limit to $\phi(T)$ in terms of acting as the most-sensitive thermometer possible. Alternatively, a near-optimal total sensitivity (such as more than 70% of the optimal total sensitivity) is also allowable for a substantially high-sensitive thermometer. Thus, this operation point is desirable for all applications.

Figure 7:
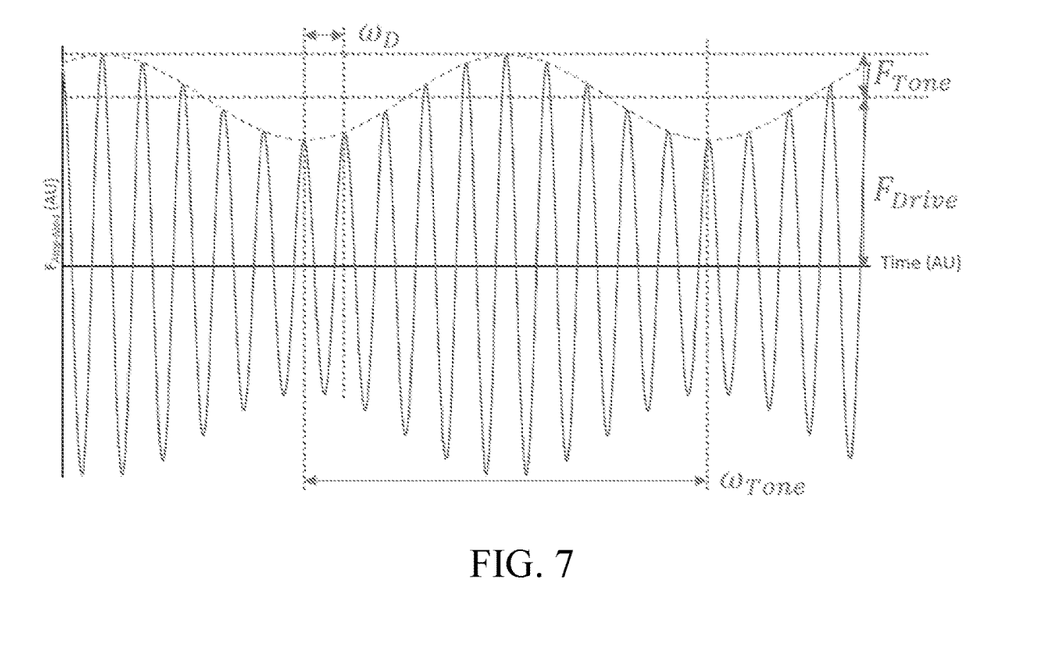
FIG. 7 is an example graph of an input force applied to the mechanical resonator-based oscillator according to one embodiment of the present disclosure.

FIG. 7 is an example graph of an input force applied to the mechanical resonator-based oscillator according to one embodiment of the present disclosure.

Mechanical resonator-based oscillators may be made by marrying resonators with feedback electronics that sustain oscillation at resonance by guaranteeing the nominal frequency of the force input of the oscillator is equal to the damped natural frequency of the resonator $\omega_D$. This fact can be leveraged by amplitude modulating a tone on the force input to the resonator, in effect creating an offset tone with the phase behavior depicted in FIG. 5

$$F_{Amp-Mod}(t) = [F_{Drive} + F_{Tone}\sin(\omega_{Tone}t)]\sin(\omega_D t) \quad (14a)$$

$$F_{Amp-Mod}(t) = \quad (14b)$$

$$F_{Drive}\sin(\omega_D t) + (F_{Tone}/2)[\cos((\omega_D - \omega_{Tone})t) - \cos((\omega_D + \omega_{Tone})t)]$$

where $F_{Drive}$ is a nominal drive force amplitude 4a, $F_{Tone}$ is a nominal tone force amplitude, and $\omega_{Tone}$ is an offset tone frequency.

The pilot tone may be amplitude modulated at both the force input of the mechanical resonator 11 and the displacement output. At the force input, the theoretical range of the amplitude is:

$$0 < F_{Tone} \leq F_{Drive}/2 \quad (15)$$

where $F_{Tone}$ is the amplitude of the lower-frequency pilot tone (referred to as the message in amplitude modulation) and $F_{Drive}$ is the amplitude of the higher-frequency drive signal referred to as the carrier in amplitude modulation At the lower limit, the tone would have zero amplitude, and thus would not be fed through the transfer function of the mechanical resonator. Beyond the upper limit, the tone amplitude would be clipped by the carrier amplitude resulting in a non-sinusoidal tone to be fed through the transfer function of the mechanical resonator. This would severely degrade the phase measurement resulting in lower total sensitivity than calculated in FIG. 6.

The most desirable or optimal operation point is a tone amplitude as high as possible (IE, $F_{Drive}/2$), but this may not always be practical. One possible reason this may not be achievable is because the projected total sensitivity is only applicable to mechanical resonators operated linearly. Substantially large carrier and tone amplitudes could potentially result in non-linearities in the resonator. A second possible limitation in the tone amplitude is that as it approaches its upper limit ($F_{Drive}/2$), sustained oscillation of the mechanical resonator could become less stable.

The input force is expressed by Equations 14a and 14b with a constant amplitude and frequency tone force ($F_{Tone}$ with $\omega_{Tone}$) which is amplitude modulated onto a constant amplitude and frequency drive force ($F_{Drive}$ with $\omega_D$) at mixer 9.

The amplitude modulation formulated in Equation 14a breaks down into the three distinct harmonic drive force terms of Equation 14b. For a linear mechanical resonator, the Principle of Superposition applies: thus, the displacement output of the resonator will be a linear combination of the distinct force inputs. For this reason, amplitude modulation can be used to synthesize a pilot tone of a fixed frequency with respect to the resonant frequency of the resonator.

The phase of the displacement output of the resonator can be measured with respect to the phase of the input force. As shown above, this phase will vary with temperature, effectively creating a 'thermometer' for temperature compensation of the oscillator output.

FIGS. 8A-8D illustrate several example plots representing the oscillation behaviors of mechanical resonator-based oscillator 10 according to embodiments of the present disclosure.

Figure 8A:
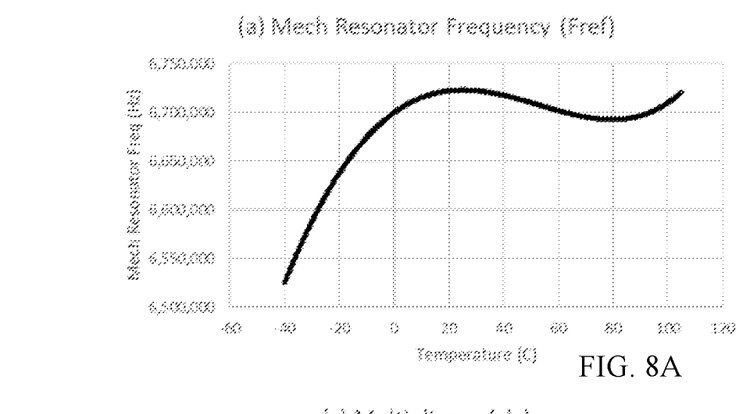
FIGS. 8A-8D illustrate several example plots representing the oscillation behaviors of the mechanical resonator-based oscillator according to embodiments of the present disclosure.

FIG. 8A illustrates an example plot depicting a temperature-sensitive frequency $f_{Ref}$ outputted from oscillation supporting circuit 15 over temperature. The frequency $f_{Ref}$ varies substantially over temperature for the timing applications.

Figure 8B:
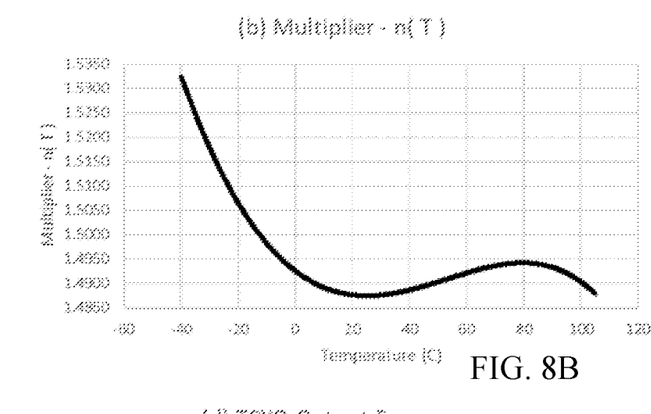

FIG. 8B illustrates an example plot depicting a multiplier function n(T) generated by temperature compensator 16 according to one embodiment of the present disclosure. Temperature compensator 16 receives the relative phase function ϕ(T) and designs multiplier function n(T) to scale the temperature-sensitive frequency $f_{Ref}$ to produce a temperature-insensitive TCXO output frequency $f_{Output}$. For the curve illustrated in FIG. 8B, the following plot can be made to represent the transfer function of temperature compensator 16.

This transfer function can be attained empirically by measurements as part of a calibration process, for example. Alternatively, this transfer function can also be attained theoretically via modeling. The transfer function may be stored in a set of polynomial coefficients to produce the multiplier function n(T) as a function of the relative phase function ϕ(T). For example:

$$n(T)=A\phi(T)^4+B\phi(T)^3+C\phi(T)^2+D\phi(T)^1+E \quad (16)$$

Here, A, B, C and D are coefficients, and E is a constant.

Figure 8C:
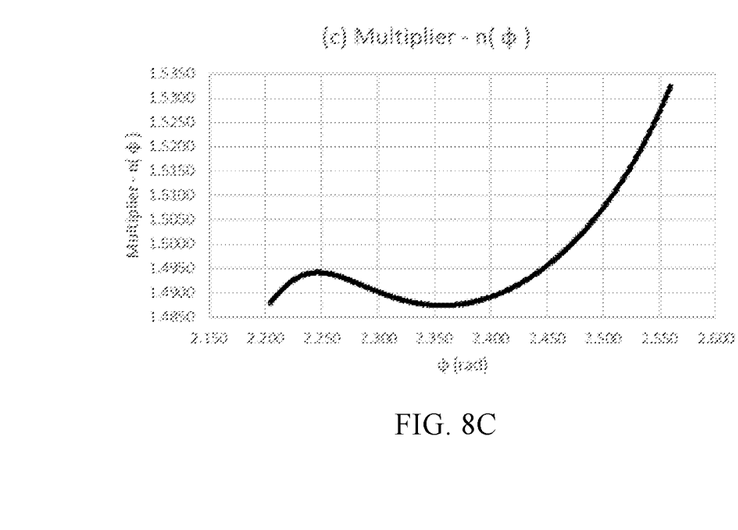
Figure 8D:
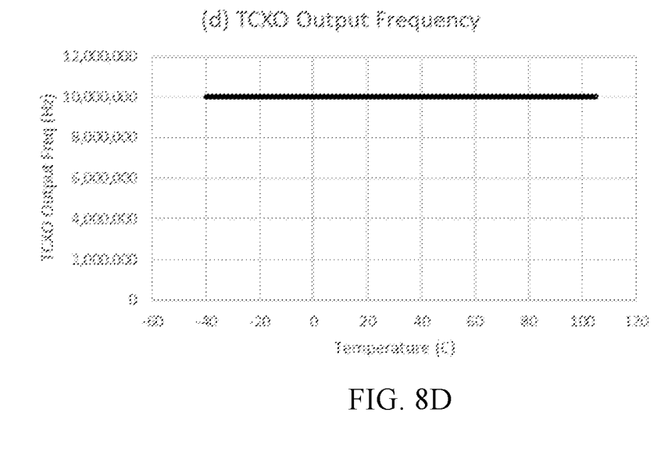

FIG. 8C illustrates an example plot of Temperature Compensated Crystal Oscillators (TCXO) frequency $f_{output}$ according to one embodiment of the present disclosure.

Frequency synthesizer 17 receives the multiplier function n(T) from temperature compensator 16 and the vibration frequency $f_{Ref}$ from filter 3. Then, frequency synthesizer 17 performs the scaling operation of the vibration frequency $f_{Ref}$ by multiplying the vibration frequency $f_{Ref}$ by the multiplier function n(T) to generate a temperature-insensitive TCXO output frequency $f_{output}$. This frequency scaling serves the following two end-application proposes.

First, frequency scaling enables the trim or adjustment of the nominal output frequency of the TCXO. TCXO frequency $f_{output}$ remains substantially constant over the temperature range, thus $f_{output}$ is a temperature-insensitive frequency. Note that in this embodiment, a nominal frequency of 10 MHz is used because it is used in several timing applications, but this nominal output frequency can be designed to whatever the end application requires by using different nominal scaling values. This may be necessary because the mechanical resonator based oscillator most-likely will not have precisely the frequency necessary for the end timing application the TCXO being used for.

Second, the frequency scaling operation enables temperature compensation of the mechanical resonator-based oscillator frequency. This may be necessary because the mechanical resonator-based oscillator output frequency can vary significantly over temperature.

In one embodiment, this frequency scaling functionality may be typically performed using a known Fractional-N Phase Locked Loop (PLL) to generate an oscillation frequency based on vibration frequency $f_{Ref}$ and the multiplier function n(T).

FIG. 8B illustrates another example plot depicting a multiplier function n(T) generated according to one embodiment of the present disclosure. The multiplier function n(T) in this figure is produced by transforming the multiplier function in FIG. 8C with ϕ(T) via X=1 in FIG. 5. This transfer function can be attained empirically by measurements as part of a calibration process, for example. Alternatively, this transfer function can also be attained theoretically via modeling.

Figure 9A:
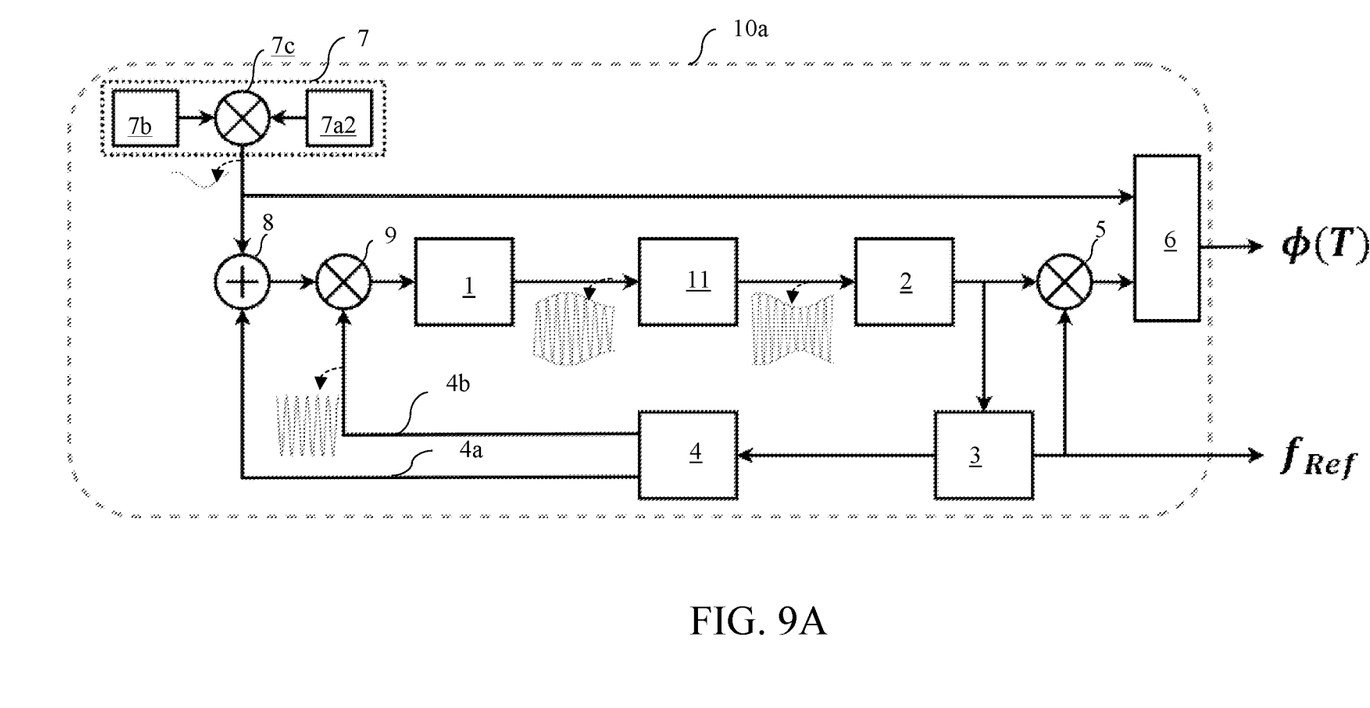
FIGS. 9A-9C illustrate three different embodiments related to pilot tone generator according to embodiments of the present disclosure.
Figure 9B:
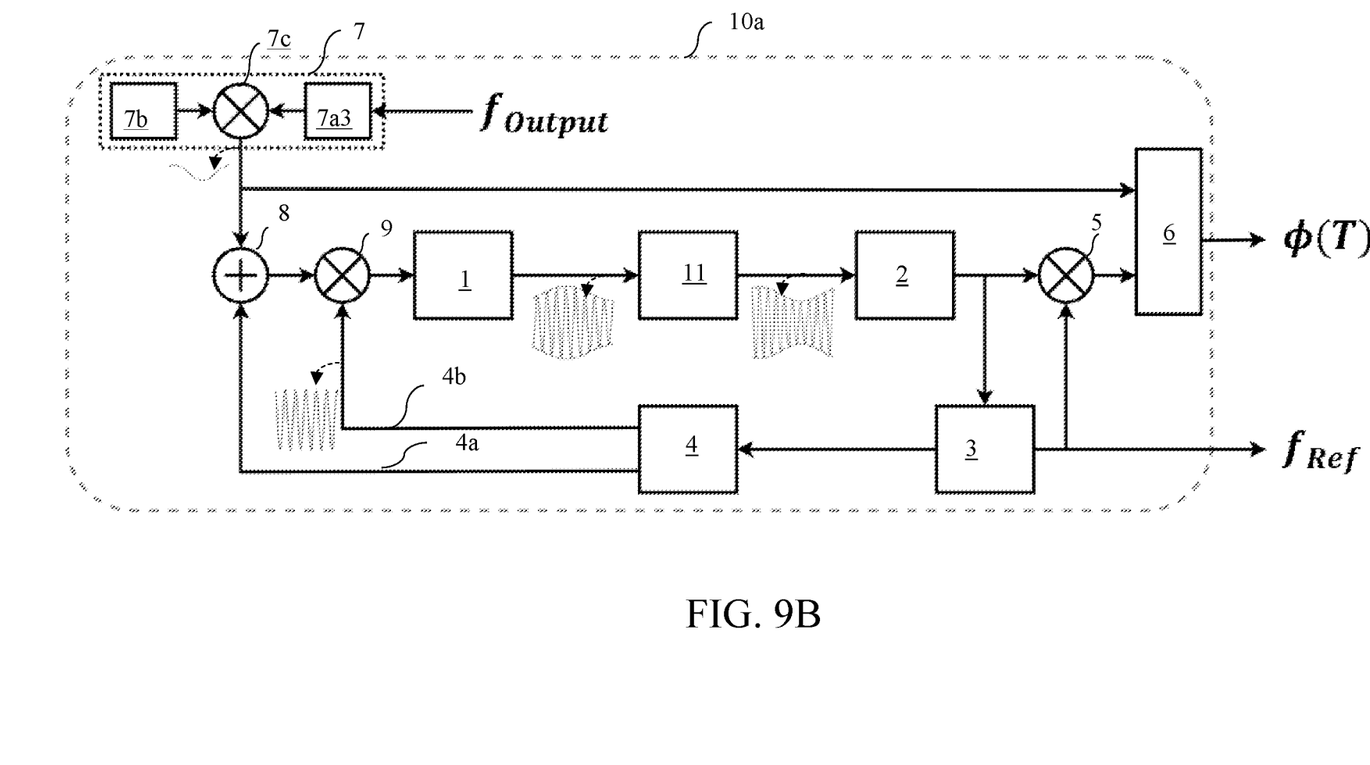
Figure 9C:
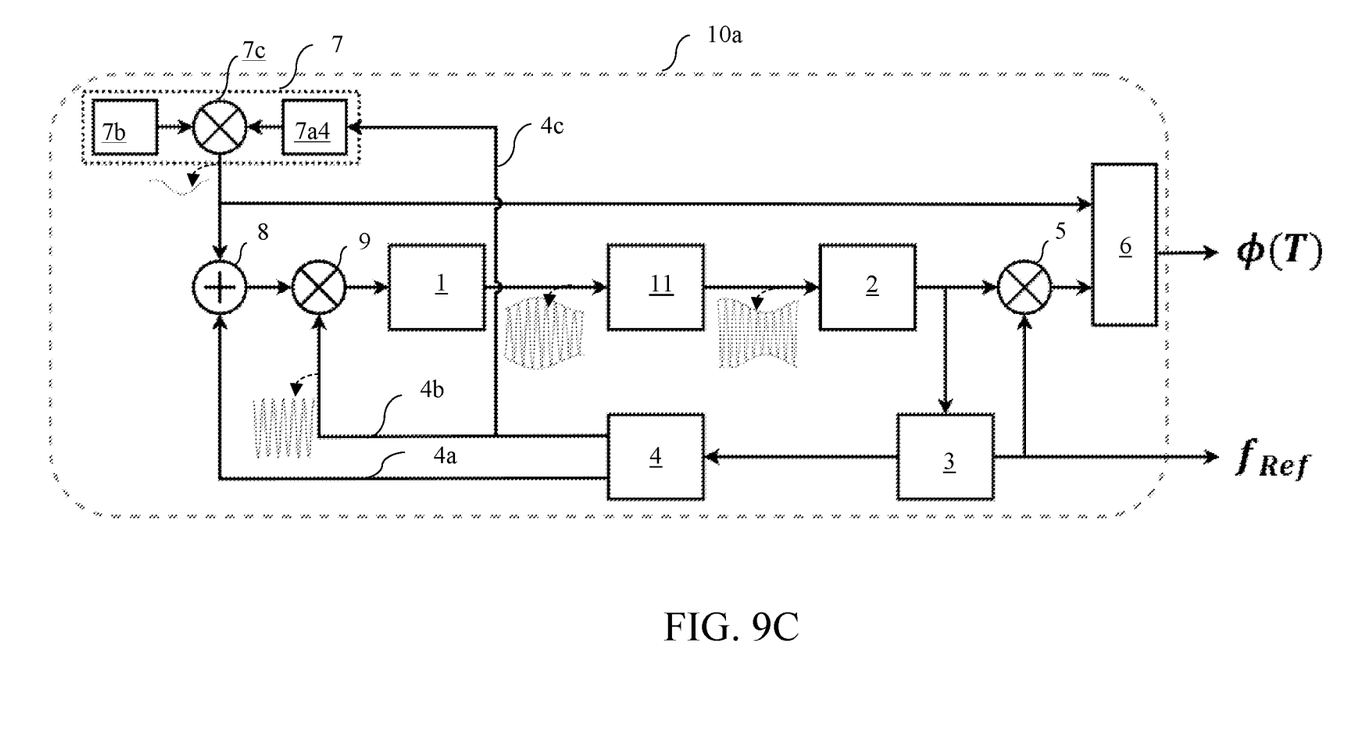

FIGS. 9A-9C illustrate three different embodiments related to pilot tone generator 7, according to embodiments of the present disclosure. The repetitive descriptions of the same components will be omitted for brevity.

FIG. 9A sources the pilot tone frequency from independent oscillator 7a2: an oscillator on- or off-chip that is independent from the MEMS resonator-base oscillator or its temperature compensation feed-forward compensation. A possible benefit of this approach is that from a system implementation standpoint, it is simple and of low complexity. A possible drawback of this approach is that this independent oscillator 7a2 may have its own temperature-dependent error and this error could negatively affect the performance of temperature compensation using the method proposed above.

FIG. 9B sources the pilot tone frequency from the output frequency of the TCXO by dividing the TXCO output frequency $f_{Output}$ at frequency divider 7a3. The benefit of using the output of the TCXO frequency is the temperature stability of this frequency. The drawback is high system-level design complexity for start-up and stability.

The relative phase signal ϕ(T) for the mechanical resonator-based oscillators illustrated in FIGS. 9A and 9B is defined as follows:

$$\phi(T) = \tan^{-1}\frac{2\zeta(T)\left(1+X\frac{BW_0}{\omega_n(T)}\right)}{1-\left(1+X\frac{BW_0}{\omega_n(T)}\right)^2} \quad (17)$$

Here, ζ(T) is the damping factor of the mechanical resonator at a temperature T at which the mechanical resonator 11 is operating, as defined in Equation 6, $\omega_n(T)$ is the natural frequency of undamped oscillation of the mechanical resonator 11 as defined in Equation 7, and $\zeta_0$ is the damping factor of the mechanical resonator at a fixed temperature. Mechanical resonators ζ(T) and $\omega_n(T)$ can be sensitive to temperature, as shown in the empirical data presented in FIG. 4.

FIG. 9C sources the pilot tone frequency from the MEMS resonator-based oscillator by dividing drive frequency 4c at frequency divider 7a4. This approach has a subtle but important advantage of eliminating the MEMS Resonator Natural Frequency temperature-dependence. For this embodiment, Equation 12b becomes $$\frac{\omega_{Tone}}{\omega_n} = 1+X\frac{1}{2Q_0} \quad (18)$$

which manifests in slightly higher total sensitivity.

The relative phase signal φ(T) for FIG. 9C may be defined as follows:

$$\phi(T) = \tan^{-1}\frac{2\zeta(T)(1+X\zeta_0)}{1-(1+X\zeta_0)^2} \quad (19)$$

Figure 9D:
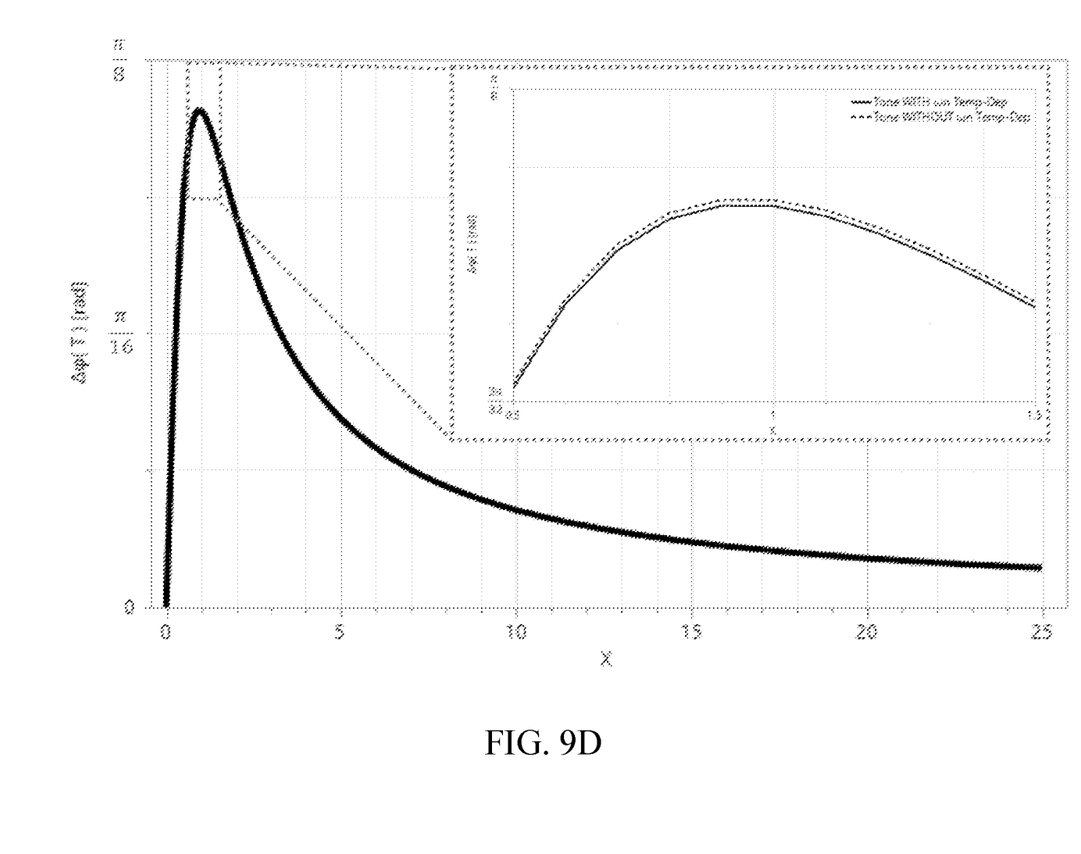
FIG. 9D illustrates a comparison of the total sensitivity of FIGS. 9A and 9B compared to that of FIG. 9C.

FIG. 9D illustrates a comparison of the total sensitivity of FIGS. 9A and 9B, which is labeled as Tone with on temperature-dependency, as compared to that of 9C, which is labeled as Tone without on temperature-dependency. Note that because Equation 19 does not have $\omega_n(T)$ dependence, it has a slight advantage in higher total sensitivity.

Figure 10:
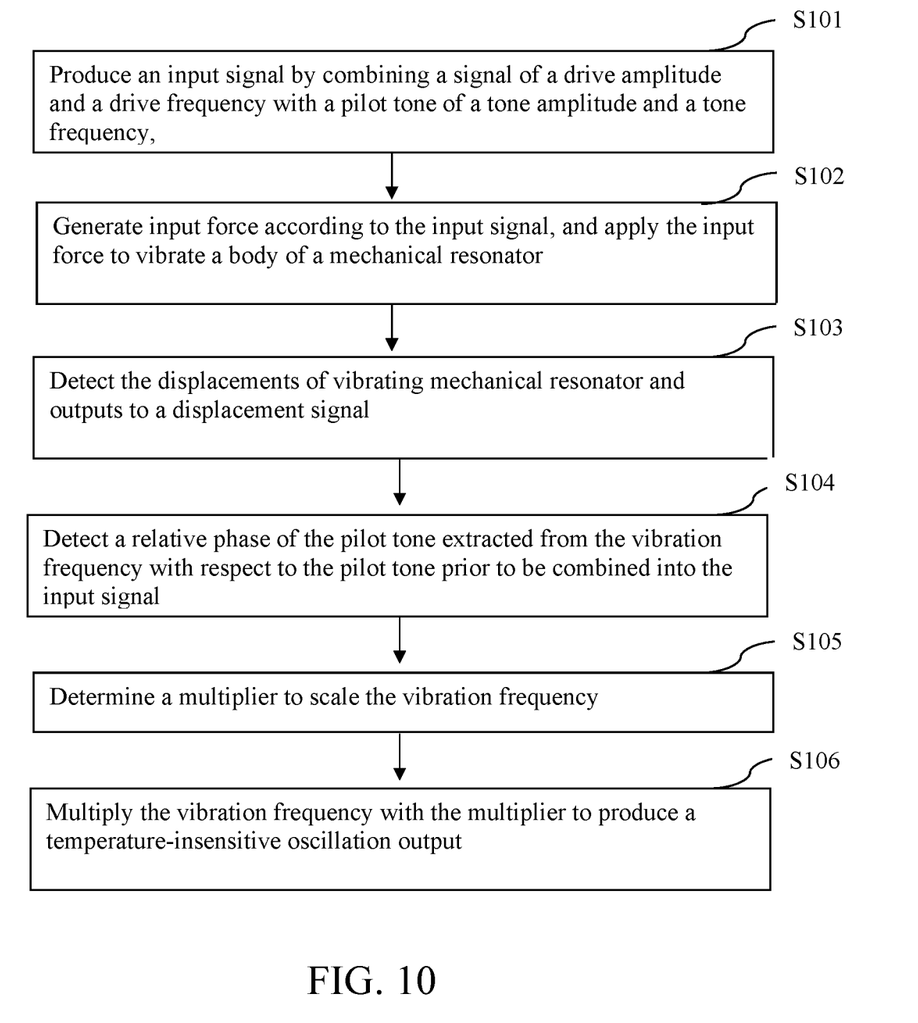
FIG. 10 illustrates an exemplary flowchart for operating a mechanical resonator-based oscillator according to embodiments of the present disclosure.

FIG. 10 illustrates an exemplary flowchart for operating a mechanical resonator-based oscillator according to embodiments of the present disclosure. The embodiment shown in FIG. 10 is for illustration only. Other embodiments could be used without departing from the scope of this disclosure.

The method begins with step S101, in which the pilot tone is added with drive amplitude 4a at adder 8, and then is modulated with drive frequency 4b at mixer 9 to produce an input signal.

In step S102, force generator 1 generates input force according to the input signal, which causes the body of mechanical resonator 11 to vibrate.

In step S103, displacement detector 2 detects the displacements of vibrating mechanical Resonator 11 and outputs to a displacement signal.

In step S104, phase detector 6 detects a relative phase of the pilot tone coming out the mechanical resonator 11 with respect to the pilot tone going into the mechanical resonator 11. The pilot tone coming out the mechanical resonator 11 may be extracted from the displacement signal via filter 3 and demodulator 5.

In step S105, temperature compensator 16 determines a multiplier to scale the vibration frequency. Once multiplier function n(T) is determined, frequency synthesizer 17 performs the scaling operation of $f_{Ref}*n(T)$ to produce a temperature-insensitive output frequency, in step S106.

The primary benefits of the output frequency temperature compensation according to the above embodiments of the present disclosure are as follows.

First of all, the temperature sensor is the mechanical resonator itself, using the same primary resonance mode of the oscillator. As such, temperature change that results in frequency error in the oscillator is very accurately and precisely detected; as a result, temperature sensing is robust to error sources rooted in physical separation of temperature sensor and resonator. From a temperature stability performance perspective this advantage manifests low hysteresis, fast settling time, and low sensitivity to thermal gradient over the device.

Also, because the temperature sensor uses the primary resonance mode of the oscillator, it may use the same (existing) input and output of the mechanical resonator. No additional inputs or outputs are necessary resulting in simplified resonator design.

What is claimed is:

1. A mechanical resonator-based oscillator comprising:
a tone oscillator configured to produce a pilot tone;
an input signal generator configured to receive the pilot tone and output an input signal containing the pilot tone;
a mechanical resonator comprising a body configured to vibrate according to the input signal containing the pilot tone and to output a vibration signal;
a phase detector configured to detect a relative phase of the vibration signal with respect to the pilot tone; and
a frequency synthesizer configured to produce a temperature-insensitive oscillation output based on the relative phase.

2. The mechanical resonator-based oscillator according to claim 1, further comprising:
a transducer configured to transduce the input signal from an electrical domain to a mechanical domain and force the mechanical resonator into vibration.

3. The mechanical resonator-based oscillator according to claim 1, further comprising:
a filter configured to receive a displacement signal and remove a lower-frequency signal from the received displacement signal to produce the vibration signal.

4. The mechanical resonator-based oscillator according to claim 3, further comprising:
a demodulator configured to demodulate the displacement signal using the vibration signal to extract the pilot tone.

5. The mechanical resonator-based oscillator according to claim 1, further comprising:
an oscillation driving circuitry configured to supply a drive amplitude and a drive frequency to the input signal generator.

6. The mechanical resonator-based oscillator according to claim 5, wherein the input signal generator further comprises:
an adder configured to add the drive amplitude to the tone amplitude of the pilot tone to produce an adjusted pilot tone; and
a mixer configured to modulate the amplified pilot tone with the drive frequency to produce the input signal with the adjusted pilot tone.

7. The mechanical resonator-based oscillator according to claim 4, further comprising:
a temperature compensator configured to determine a multiplier to scale the relative phase, wherein
the frequency synthesizer is configured to perform a scale operation on the vibration signal by the multiplier to produce the temperature-insensitive oscillation output.

8. The mechanical resonator-based oscillator according to claim 7, wherein the temperature compensator is configured to determine a multiplier function n(T) to scale a relative phase function φ(T), wherein the multiplier function n(T) indicates changes in the multiplier over temperatures, and the relative phase function φ(T) indicates changes in the relative phase over temperatures, T being a temperature.

9. The mechanical resonator-based oscillator according to claim 8, wherein an offset tone of the input signal $\omega_{Tone}$ is defined by:

$$\omega_{Tone} = \omega_n + XBW_0$$

wherein X is a positive scalar of a resonator fixed-temperature mechanical bandwidth $BW_0$:

$$BW_0 = \frac{(\omega_n)_0}{2Q_0}$$

wherein $(\omega_n)_0$ and $Q_0$ are a undamped natural frequency and a quality factor of the mechanical resonator at a fixed temperature, respectively.

10. The mechanical resonator-based oscillator according to claim 1,
wherein the tone oscillator is independent from the mechanical resonator-based oscillator.

11. The mechanical resonator-based oscillator according to claim 9, wherein the relative phase function φ(T) is calculated as follow:

$$\phi(T) = \tan^{-1} \frac{2\zeta(T)\left(1 + X\frac{BW_0}{\omega_n(T)}\right)}{1 - \left(1 + X\frac{BW_0}{\omega_n(T)}\right)^2}$$

wherein ζ(T) is a damping factor of the mechanical resonator at temperature T at which the mechanical resonator is operating, $\omega_n(T)$ is a natural frequency of undamped oscillation of the mechanical resonator at temperature T, and $\zeta_0$ is a damping factor of the mechanical resonator at a fixed temperature.

12. The mechanical resonator-based oscillator according to claim 7, further comprising:
a frequency divider configured to divide the temperature-insensitive oscillation output and provide a divided portion of the temperature-insensitive oscillation output to the input signal generator as a tone frequency of the pilot tone.

13. The mechanical resonator-based oscillator according to claim 8, wherein the relative phase function φ(T) is calculated as follow:

$$\phi(T) = \tan^{-1} \frac{2\zeta(T)\left(1 + X\frac{BW_0}{\omega_n(T)}\right)}{1 - \left(1 + X\frac{BW_0}{\omega_n(T)}\right)^2}$$

wherein ζ(T) is a damping factor of the mechanical resonator at temperature T at which the mechanical resonator is operating, $\omega_n(T)$ is a natural frequency of undamped oscillation of the mechanical resonator at temperature T, and $\zeta_0$ is a damping factor of the mechanical resonator at a fixed temperature.

14. The mechanical resonator-based oscillator according to claim 5, comprising:
a frequency divider configured to divide the drive frequency of the oscillation driving circuitry and provide a divided portion of the drive frequency to the input signal generator as a tone frequency of a pilot tone.

15. The mechanical resonator-based oscillator according to claim 8, wherein the relative phase function φ(T) is calculated as follow:

$$\phi(T) = \tan^{-1} \frac{2\zeta(T)(1 + X\zeta_0)}{1 - (1 + X\zeta_0)^2}$$

wherein ζ(T) is a damping factor of the mechanical resonator at temperature T at which the mechanical resonator is operating, $\omega_n(T)$ is a natural frequency of undamped oscillation of the mechanical resonator at temperature T, and $\zeta_0$ is a damping factor of the mechanical resonator at a fixed temperature.

16. The mechanical resonator-based oscillator according to claim 9, wherein
a value of X is selected such that the mechanical resonator-based oscillator comes to have an optimal total sensitivity of the relative phase function φ(T) with respect to a temperature range within which the mechanical resonator-based oscillator is supposed to operate.

17. A method of operating a mechanical resonator-based oscillator, the method comprising:
providing a pilot tone;
receiving the pilot tone and providing an input signal containing the pilot tone;
applying the input signal to vibrate a body of a mechanical resonator to output a vibration signal;
detecting a relative phase of a pilot tone extracted from the vibration signal with respect to the pilot tone; and
producing a temperature-insensitive oscillation output based on the relative phase of the vibration signal.

18. The method according to claim 17, wherein
the combining step further comprises:
adding a drive amplitude to a tone amplitude of the pilot tone to produce an adjusted pilot tone; and
modulating the adjusted pilot tone with a drive frequency to produce the input signal containing the adjusted pilot tone.

19. The method according to claim 18, further comprising:
receiving a displacement signal from a displacement detector;
filtering out, by a filter, a lower-frequency signal from the received displacement signal to produce a vibration signal; and
demodulating the displacement signal using the vibration signal to extract the pilot tone.

20. The method according to claim 19, wherein
the step of producing the temperature-insensitive oscillation output comprises:
determining a multiplier to scale the vibration signal; and
multiplying the vibration signal with the multiplier to produce the temperature-insensitive oscillation output.

* * * * *